United States Patent
Yanagisawa

(10) Patent No.: US 6,870,200 B2
(45) Date of Patent: Mar. 22, 2005

(54) INSULATED GATE TYPE SEMICONDUCTOR DEVICE HAVING A DIFFUSION REGION CONTACTING BOTTOM AND SIDE PORTIONS OF TRENCHES

(75) Inventor: Satoshi Yanagisawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/430,224

(22) Filed: May 7, 2003

(65) Prior Publication Data

US 2004/0178441 A1 Sep. 16, 2004

(30) Foreign Application Priority Data

Mar. 11, 2003 (JP) ........................................ 2003-065093

(51) Int. Cl.$^7$ ............................................... H01L 29/78
(52) U.S. Cl. .................... 257/139; 257/133; 257/137; 257/328; 257/329; 257/330
(58) Field of Search ................................ 257/124, 133, 257/137–139, 141, 146, 147, 328–333

(56) References Cited

U.S. PATENT DOCUMENTS 5,448,083 A 9/1995 Kitagawa et al.
5,719,409 A 2/1998 Singh et al.
2002/0070418 A1 6/2002 Kinzer et al.

FOREIGN PATENT DOCUMENTS

| GB | 2314206 A | * 12/1997 | ........... H01L/29/06 |
|---|---|---|---|
| JP | 10-163483 | 6/1998 | |
| JP | 2002-164542 | 6/2002 | |

* cited by examiner

*Primary Examiner*—Minhloan Tran
*Assistant Examiner*—Thomas L Dickey
(74) *Attorney, Agent, or Firm*—Oblon, Spivak, McClelland, Maier & Neustadt, P.C.

(57) ABSTRACT

A surface region of a first base layer is formed with a second base layer. Trenches are formed over a range from the surface of the second base layer to the first base layer. The second base layer is divided into base layers. Each of first trenches is formed with a trench gate electrode. An emitter layer is formed in a surface region of the base layer intermittently selected from base layers positioned between first trenches, and contacts with the trench. Dummy trenches are formed over a range from the surface of the base region where the emitter layer is not formed to the first base layer at a position near to each of trenches. A diffusion region is formed in the first base layer to contact with the side portion of dummy trenches formed at the bottom of each trench and a position near thereto.

19 Claims, 17 Drawing Sheets

INSULATED GATE TYPE SEMICONDUCTOR DEVICE HAVING A DIFFUSION REGION CONTACTING BOTTOM AND SIDE PORTIONS OF TRENCHES

CROSS-REFERENCE TO RELATED APPLICATIONS

This application is based upon and claims the benefit of priority from the prior Japanese Patent Application No. 2003-065093, filed Mar. 11, 2003, the entire contents of which are incorporated herein by reference.

BACKGROUND OF THE INVENTION

1. Field of the Invention

The present invention relates to an insulated gate type semiconductor device, and a method of manufacturing the same. In particular, the present invention relates to the structure of a power semiconductor element having a trench gate, and to a method of manufacturing the same.

2. Description of the Related Art

One type of power insulated-gate bipolar transistor (power IGBT), that is, a trench IGBT, is configured in a manner that trench IGBT cells having the trench gate structure are provided in parallel on a semiconductor substrate. Each trench IGBT cell has the trench gate structure using the trench sidewall of a MOS gate buried in a trench as a channel region. In the trench IGBT as described above, channel resistance is reduced, and low loss is facilitated.

JPN. PAT. APPLN. KOKAI Publication No. 10-163483 by the same assignee as the present application discloses the following advanced injection enhanced gate transistor (IEGT). The IEGT uses the trench gate structure and carrier storage effect on the emitter side. The entire contents of the reference are incorporated herein by reference.

FIG. 1 is a cross-sectional view schematically showing the structure of the IEGT disclosed in the reference. FIG. 2 is an enlarged sectional view showing part of the IEGT shown in FIG. 1.

In the IEGT shown in FIG. 1 and FIG. 2, a P⁻ base layer 107 is formed on the surface of an N⁻ base layer 101 having high resistance. Several P⁺ base layers 107a are selectively formed on the surface region of the P⁻ base layer 107 along the horizontal direction at constant pitch. Several trenches are selectively formed at constant pitch having the depth ranging from the surface of the P⁻ base layer 107 to the N⁻ base layer 101. A trench gate electrode 106 is buried in each trench via a gate insulator 105.

An N⁺ emitter layer 108 having high impurity concentration is selectively formed to contact with the side of the adjacent trench. In this case, the N⁺ emitter layer 108 is formed in the surface region of the P⁺ base layer 107a selected at intervals of the constant number of P⁺ base layers 107a and in the surface region of the P⁻ base layer 107 adjacent thereto. The N⁺ emitter layer 108 is not formed in the surface region of the remaining P⁺ base layers 107a, which are not selected, and the surface region of the P⁻ base layer 107 adjacent thereto.

An emitter electrode 109 is provided on the N⁺ emitter layer 108 and the P⁺ base layer 107a contacting therewith to contact with both of the former and the latter. The emitter electrode 109 short-circuits the N⁺ emitter layer 108 and the P⁺ base layer 107a.

An interlayer dielectric 111 is provided to electrically isolate the emitter electrode 109 from P⁺ and P⁻ base layers 107a and 107, which are not formed with the trench gate electrode 106 and the N⁺ emitter layer 108. Each trench gate electrode 106 is drawn out to a gate pad 116 via a polysilicon gate interconnect (wiring) pattern 115. The interlayer dielectric 111 electrically isolates the gate pad 116 and the emitter electrode 109.

On the other hand, the back side of the N⁻ base layer 101 is formed with a P⁺ collector layer 103 having a high impurity concentration via an N⁺ buffer layer 102 having high impurity concentration. A collector electrode 110 is provided on the P⁺ collector layer 103.

In FIG. 1, reference numerals 16, 13, 14 and 117 denote guard ring, field plate, N+ filed stopper layer, and passivation insulator, respectively.

In the structure described above, the N⁻ base layer 101, P⁻ base layer 107, N⁺ emitter layer 108, gate insulator 105 and trench gate electrode 106 constitute a MOSFET. In the MOSFET, electrons are injected from the N⁺ emitter layer 108 to the N⁻ base layer 101 through a channel region formed in the surface region contacting with the trench of the P³¹ base layer 107.

The operation of the IEGT shown in FIG. 1 and FIG. 2 will be briefly described.

In order to turn on the IEGT, a predetermined positive gate voltage is applied between the trench gate electrode 106 and the emitter electrode 109. In this case, the gate voltage is applied in a state that a positive collector voltage is applied between the collector and emitter electrodes 110 and 109. By doing so, the surface region contacting with the gate insulator 105 of the P⁻ base layer 107 is inverted to n type, so that an inverted channel can be formed. Thus, electrons are injected from the emitter electrode 109 to the N⁻ base layer 101 through the inverted channel, and thereafter, reach the p-type collector 103. In this case, the junction between the p-type collector 103 and the N⁻ base layer 101 is forward-biased via the N⁺ buffer layer 102. In addition, holes are injected from the p-type collector 103 to the N⁻ base layer 101 via the N⁺ buffer layer 102. As described above, both electrons and holes are injected to the N⁻ base layer 101. As a result, conductivity modulation occurs in the N⁻ base layer 101, so that the resistance of the N⁻ base layer 101 can be greatly reduced.

In the operation, carriers are stored to the portion formed with no N⁺ emitter layer 108 of P⁻ base layers 107 held between adjacent trenches, that is, under a dummy base region. Thus, conductivity modulation effect is enhanced, so that on resistance can be reduced and the maximum cutoff current density can be made high.

On the other hand, in order to turn off the IEGT, a negative voltage to the emitter electrode 109 or voltage equal to (voltage applied to the emitter electrode 109) is applied to the trench gate electrode 106. By doing so, the inverted channel is lost; therefore, electron injection stops. With the stoppage of electron injection, injection of holes to the P⁻ base layers 107 stops, and the resistance of the N⁻ base layer 101 becomes high; therefore, the IEGT turns off.

However, the IEGT having the structure described above has the following problem when turning on. That is, the gate voltage oscillates by the effect of capacitance generated between carriers stored under the dummy base region and the trench gate electrode 106, and steps up more than the necessary. For this reason, the switching speed (dV/dt) becomes abnormally high; as a result, there is a possibility that the element is broken down.

FIG. 3 is a waveform diagram showing one example of oscillation of gate voltage (VGE) generated by carriers stored near the gate in the IEGT shown in FIG. 1 and FIG. 2. In FIG. 3, IC is a collector current, and VCE is a voltage between collector and emitter.

In general, the switching speed (dV/dt) control of the IGBT is carried out by controlling the gate current in accordance with the value of the gate resistor connected outside. However, in the IEGT having the structure shown in FIG. 1 and FIG. 2, the gate voltage changes by storage carriers. For this reason, it is difficult to control the gate current by the external gate resistor.

As described above, the conventional IEGT has the following problem. Carriers are stored near the gate, and thereby, when the IEGT turns on, the gate voltage oscillates, and steps up more than the necessary. For this reason, the switching speed (dV/dt) becomes abnormally high; as a result, there is a possibility that the element is broken down. Therefore, it is desired to solve the foregoing problem.

BRIEF SUMMARY OF THE INVENTION

According to one aspect of the present invention, there is provided an insulated gate type semiconductor device comprising:

a first base layer of a first conductive type having first and second surfaces;

a second base layer of a second conductive type formed in the first surface region of the first base layer;

a plurality of trenches formed over a range from the surface of the second base layer to the first base layer, and dividing the second base layer into a plurality of base layers;

a plurality of trench gate electrodes formed in the plurality of trenches via a gate insulator;

an emitter layer of a first conductive type formed in a surface region of at least one base layer intermittently selected from the plurality of base layers positioned between the plurality of trenches, and contacting with the selected trench;

a collector layer of a second conductive type formed on the second surface of the first base layer;

a first main electrode formed to contact with each of at least one base region and the emitter layer;

a second main electrode electrically connected to the collector layer;

a plurality of dummy trenches formed over a range from the surface of the base region of the plurality of base regions where the emitter layer is not formed to the first base layer at a position near to each of the plurality of trenches; and a first diffusion region of a second conductivity type formed in the first base layer and contacting a bottom portion of each trench and a dummy-trench-side side portion of each trench.

According to another aspect of the present invention, there is provided A method of manufacturing an insulated gate type semiconductor, comprises:

preparing a substrate having a collector layer of a second conductive type formed with a first base layer of a first conductive type;

forming a second base layer of a second conductive type in a selected region in the surface of the first base layer;

forming a plurality of emitter layers each of a first conductive type in an intermittently selected region in the surface of the second base layer;

forming a plurality of first trenches over a range from the surface of the second base layer to the first base layer to contact with the plurality of emitter layer while forming a plurality of second dummy trenches over a range from the surface of the second base layer to the first base layer at a position near to each of the plurality of first trenches;

implanting impurity ions of a second conductive type to each bottom surface of the plurality of second trench;

forming a gate insulator on each inner peripheral surface of the plurality of first and second trenches; and forming a conductor in each of the plurality of first and second trenches.

BRIEF DESCRIPTION OF THE SEVERAL VIEWS OF THE DRAWING

FIG. 7 is a waveform diagram showing the operation when the IEGT shown in FIG. 4 turns on;

DETAILED DESCRIPTION OF THE INVENTION

Embodiments of the present invention will be described below with reference to the accompanying drawings.

<Structure of First Embodiment>

Figure 4:
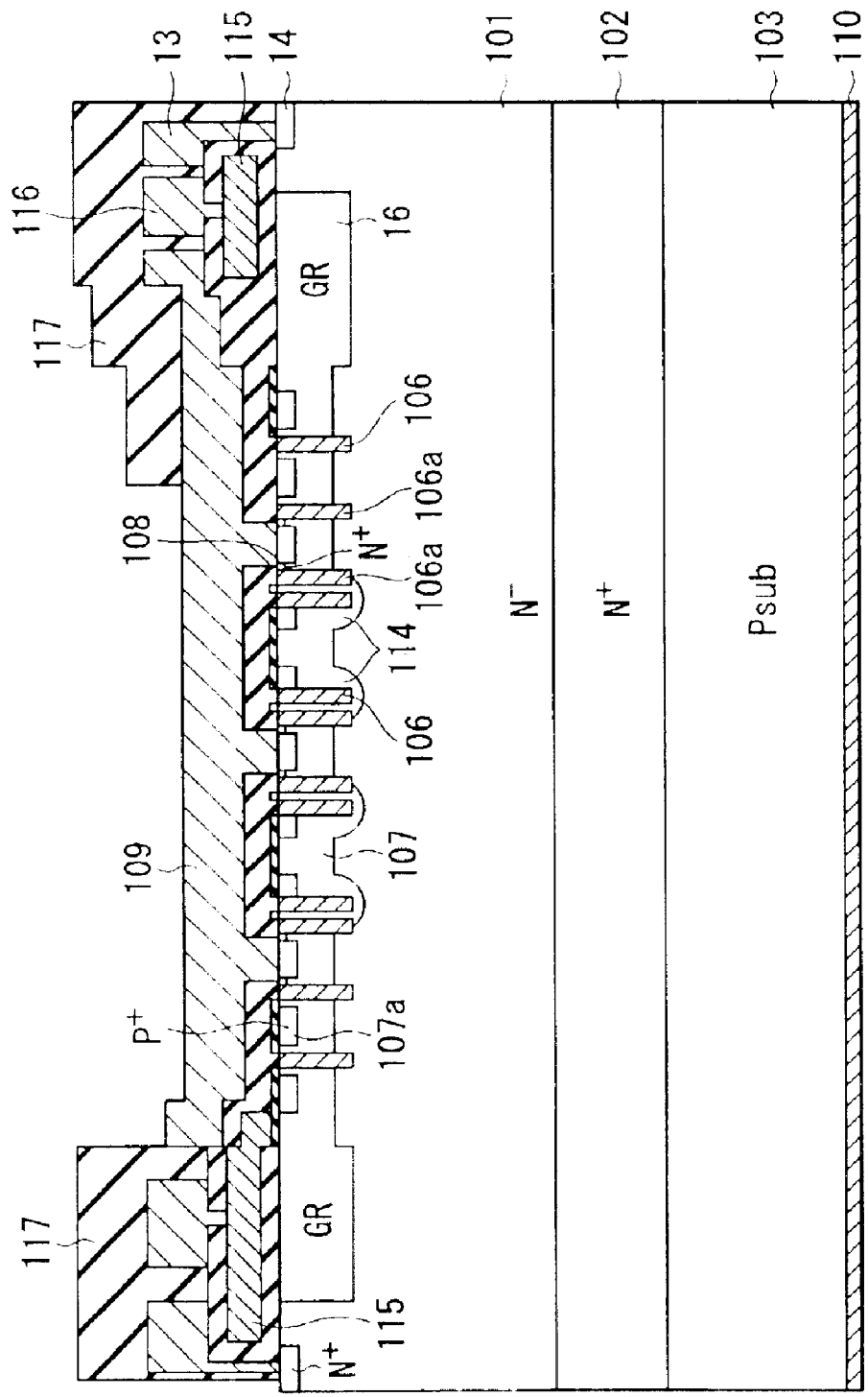
FIG. 4 is a cross-sectional view schematically showing the structure of an IEGT according to a first embodiment of the present invention.
Figure 5:
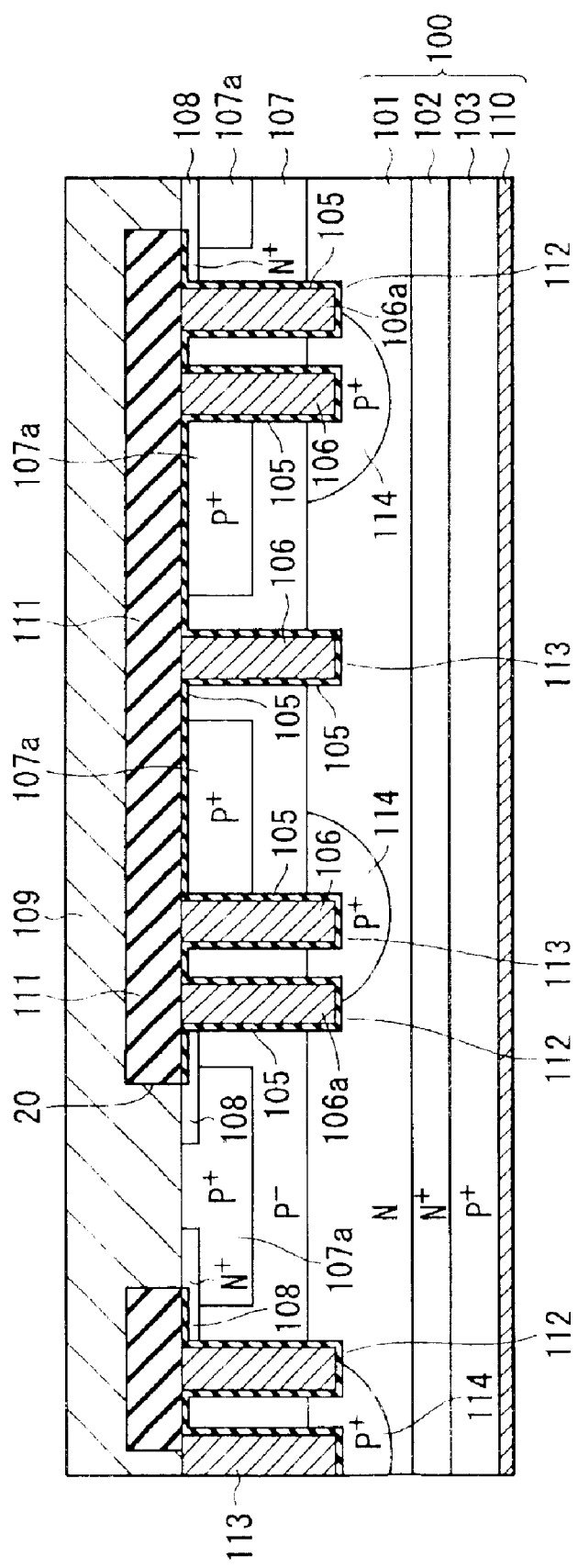
FIG. 5 is a cross-sectional view schematically showing the structure of principal parts of the IEGT shown in FIG. 4.

FIG. 4 is a cross-sectional view schematically showing the structure of an IEGT according to the first embodiment. FIG. 5 is a cross-sectional view schematically showing part of the IEGT shown in FIG. 4. In FIG. 4 and FIG. 5, the same reference numerals are used to designate portions corresponding to FIG. 1 and FIG. 2.

In the IEGT shown in FIG. 4 and FIG. 5, a P⁻ base layer 107 is formed on the surface of a high resistance N⁻ base layer 101. A plurality of P⁺ base layers 107a are selectively formed in a surface region of the P⁻ base layer 107 at constant pitch in the horizontal direction. A plurality of trenches 112 are selectively formed at constant pitch having the depth ranging from the surface of the P⁻ base layer 107 to the N⁻ base layer 101. The P⁻ base layer 107 is divided into a plurality of base regions by trenches 112. A trench gate electrode 106a is buried in each of trenches 112 via a gate insulator 105. The trench gate electrode 106a functions as a MOS gate.

An $N^+$ emitter layer 108 having high impurity concentration is selectively formed to contact with the side of the adjacent trench 112. In this case, the $N^+$ emitter layer 108 is formed in the surface region of the $P^+$ base layer 107a held between paired trenches 112 of $P^+$ base layers 107a and in the surface region of the $P^{31}$ base layer 107 adjacent thereto.

A plurality of dummy trenches 113 are formed at the position near to each of trenches 112 in base regions, that is, in a dummy base region where the $N^+$ emitter layer 108 is not formed. Each dummy trench 113 has the depth ranging from the surface of the $P^+$ base layer 107a to the $N^-$ base layer through the $P^-$ base layer 107, that is, the depth approximately same as each trench 112.

Polysilicon 106 is buried in each dummy trench 113 via a trench gate insulator 105. The polysilicon 106 buried in each trench 113 is electrically insulated from each trench gate electrode 106a.

A plurality of $P^+$ diffusion regions 114 are formed in the $N^-$ base layer 101 to contact with the bottom surface of each trench 112 functioning as a MOS gate and the side of each dummy trench 113 formed at the position near thereto. Preferably, $P^+$ diffusion regions 114 are formed to cover the entire bottom surface of each dummy trench 113. Each $P^+$ diffusion region 114 is formed contacting with the $P^-$ base layer 107.

An emitter electrode 109 is provided on the $N^+$ emitter layer 108 and the $P^+$ base layer 107a adjacent thereto to contact both of the former and the latter. The emitter electrode 109 short-circuits the $N^+$ emitter layer 108 and the $P^+$ base layer 107a. An interlayer dielectric 111 is provided on the trench gate electrode 106a, $P^+$ base layers 107a where the $N^+$ emitter layer 108 is not formed, and $P^-$ base layer 107 so that the emitter electrode 109 can be electrically isolated from those. Each trench gate electrode 106a is drawn out to a gate pad 116 via a polysilicon gate interconnect (wiring) pattern 115. The interlayer dielectric 111 is provided to electrically isolate the gate pad 116 and the emitter electrode 109.

The back side of the $N^-$ base layer 101 is formed with a $P^+$ collector layer 103 having high impurity concentration via an $N^+$ buffer layer 102 having high impurity concentration. A collector electrode 110 is provided on the $P^+$ collector layer 103. Incidentally, the $N^+$ buffer layer 102 is omitted if necessary breakdown voltage is satisfied with another method.

An $N^-/N^+/P^+$ wafer 100 may be used as one example of the multi-layer including the $N^-$ base layer 101, $N^+$ buffer layer 102 and $P^+$ collector layer 103. The $N^-/N^+/P^+$ wafer 100 is obtained in the following manner. That is, the $N^+$ buffer layer 102 is formed on a $P^+$ substrate by epitaxial growth, and further, the relatively high resistance $N^-$ base layer 101 is formed thereon by epitaxial growth. The following wafer may be used as another example. The wafer is obtained in a manner that an $N^-$ base layer is formed on an $N^+$ substrate, and the back side of the $N^+$ substrate is formed with a $P^+$ collector layer. The following wafer may be used as still another example. The wafer is obtained in a manner that the $N^-$ substrate is used as the $N^-$ base layer, and the back side of the $N^-$ substrate is formed with a collector layer.

A guard ring 16 is formed in the surface region of the outer peripheral portion of the element forming region of the semiconductor substrate. The outermost peripheral region of the semiconductor substrate is formed with an $N^+$ filed stopper layer 14 for stopping depletion. The element termination is formed with a field plate 13, which contacts with the field stopper layer 14. The entire surface of the wafer is covered with a passivation insulator 117.

In the structure described above, the $N^-$ base layer 101, $P^-$ base layer 107, $N^+$ emitter layer 108, gate insulator 105 and trench gate electrode 106a constitute the following MOSFET. In the MOSFET, electrons are injected from the $N^+$ emitter layer 108 to the $N^-$ base layer 101 through an n-type inverted channel formed in the surface region of the $P^-$ base layer 107 contacting with the trench 112.

Figure 6:
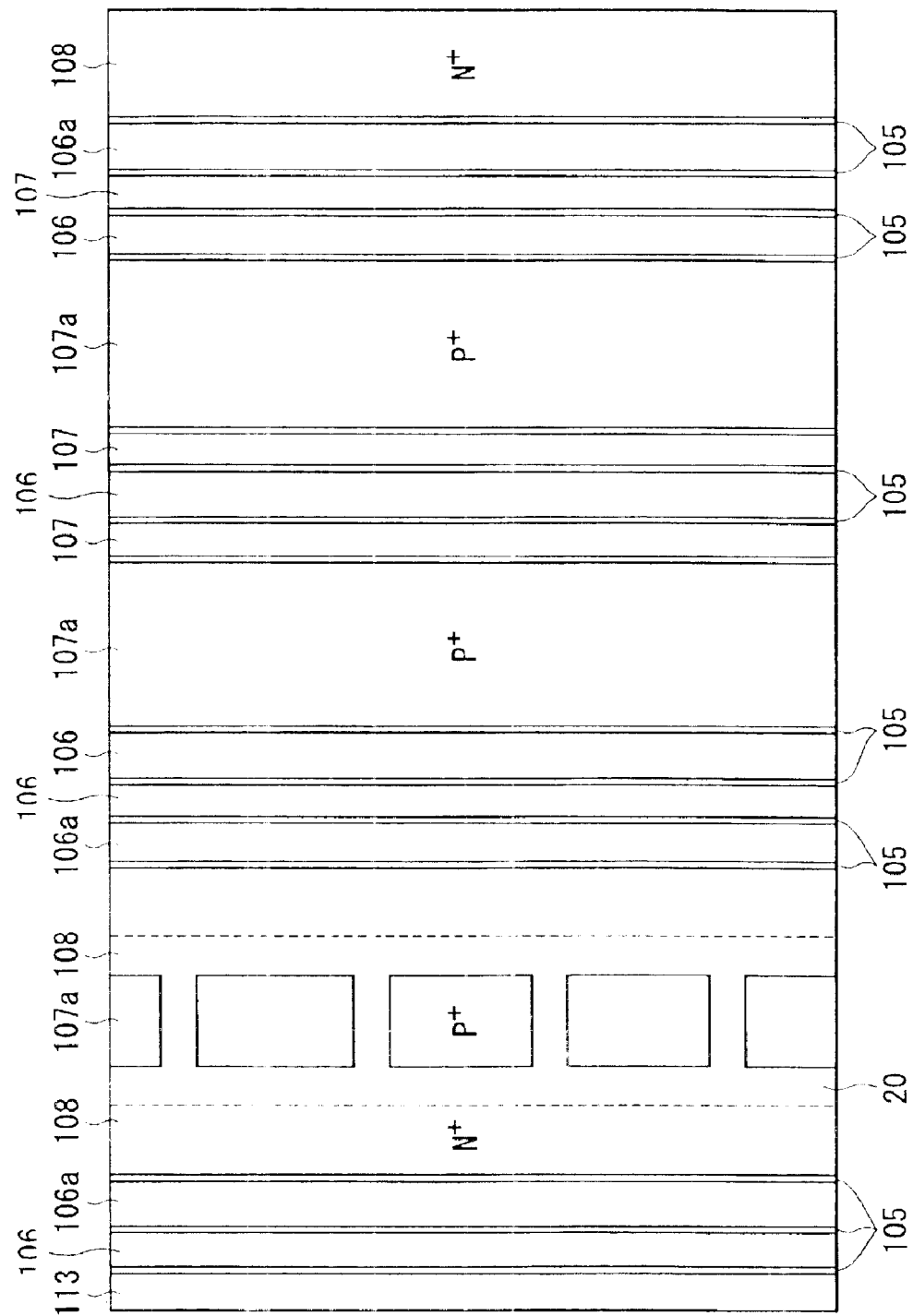
FIG. 6 is a plan view showing one example of a pattern layout corresponding to FIG. 5.

FIG. 6 is a plan view showing one example of a pattern layout corresponding to FIG. 5. In FIG. 6, the surface of the $P^+$ base layer 107a is coated with an oxide film. In this case, the oxide film is coated except a contact hole 20, which is formed in the interlayer dielectric 111 so that the emitter electrode 109 can contact with the $N^+$ emitter layer 108 and the $P^+$ base layer 107a.

The trenches 112 are selectively formed at constant pitch in the stripe-shaped plane pattern. The trench gate electrode 106a is buried in each trench 112 via the gate insulator 105.

The $N^+$ emitter layer 108 having high impurity concentration is selectively formed to contact with the side of the trench 112. More specifically, the $N^+$ emitter layer 108 is formed in the surface region of the $P^+$ and $P^-$ base layers 107a and 107 in the base region intermittently selected from base regions held between trenches 112, usually, at constant intervals.

In the embodiment, the $N^+$ emitter layer 108 is formed to have a ladder-shaped plane pattern, as shown in FIG. 6. The ladder-shaped plane pattern is composed of two parts. One is parts formed between trenches 112 along longitudinal both side of the trench, and another is parts crossing the $P^+$ base layer 107 along the longitudinal direction of the trench 112 at equal interval. By doing so, strip-shaped $N^+$ emitter layers 108 and exposed portions of the $P^+$ base layer 107a alternately exist between trenches 112, that is, between the emitter layers along both sides of the longitudinal direction of the trench 112.

The $N^+$ emitter layer 108 is not limited to the plane patter described above. For example, the $N^+$ emitter layer 108 may be formed to have a stripe-shaped plane pattern crossing the $P^+$ base layer 107a at constant interval along the longitudinal direction of the trenches 112 between trenches 112. In this case, $N^+$ emitter layers 108 and exposed portions of the $P^+$ base layer 107a alternately exist between trenches 112 along the longitudinal direction of the trenches 112.

The $N^+$ emitter layer 108 is not formed in the remaining base region of several base regions held between trenches 112, which is not intermittently selected, that is, in the surface region of each dummy region. The dummy base region has the stripe-shape plane pattern same as the trenches 112.

Therefore, the trench gate electrodes 106a are positioned side the $N^+$ emitter layer 108 adjacent to the base region, which is formed with the $N^+$ emitter layer 108, and function as a MOS gate. The remaining trench gate electrodes 106a are positioned between the dummy base regions, which are not adjacent to the base region formed with the $N^+$ emitter layer 108, and has no $N^+$ emitter layer 108.

The emitter electrode 109 is provided to short-circuit the $P^+$ base layer 107a and the $N^+$ emitter layer 108 in the base region, which is formed with the $N^+$ emitter layer 108. In this case, the emitter electrode 109 contacts in common with the $P^+$ base layer 107a and the $N^+$ emitter layer 108 via the contact hole 20 to short-circuit both layers. The contact hole 20 is for drawing out the emitter and base, and is opened in the interlayer dielectric 111 deposited on the substrate.

On the contrary, in the base region, which is not formed with the N+ emitter layer 108, the gate insulator (oxide film) 105 extends on the P− base layer 107, and the interlayer dielectric 111 is formed on the gate insulator 105. By doing so, the P− base layer 107 and the emitter electrode 109 are electrically isolated from each other.

In the first embodiment, the P+ diffusion region 114 is formed over the range from one side (dummy trench side) to the bottom surface around the bottom of the trench gate electrode 106a functioning as the MOS gate.

The P+ diffusion region 114 is extended over the range from the bottom of the dummy trench 113 to the bottom of the trench 112, and is formed to contact with the upward P− base layer 107 in the N− base layer 101 region. Incidentally, the P+ diffusion region 114 has non-symmetrical diffusion distribution of the side on the dummy trench 113 and the opposite side in the bottom of the trench 112.

In order to readily form the P+ diffusion region 114 around the bottom of the trench gate electrode 106a with high accuracy, the dummy trench 113 is formed. In this case, the interval between the trench 112 and the dummy trench 113 is set less than 1.0 μm based on the reason described later.

The dummy trench 113 and the trench 112 are simultaneously formed, and their gate insulators 105 are also simultaneously formed. By doing so, it is possible to prevent the increase of process.

Figure 1:
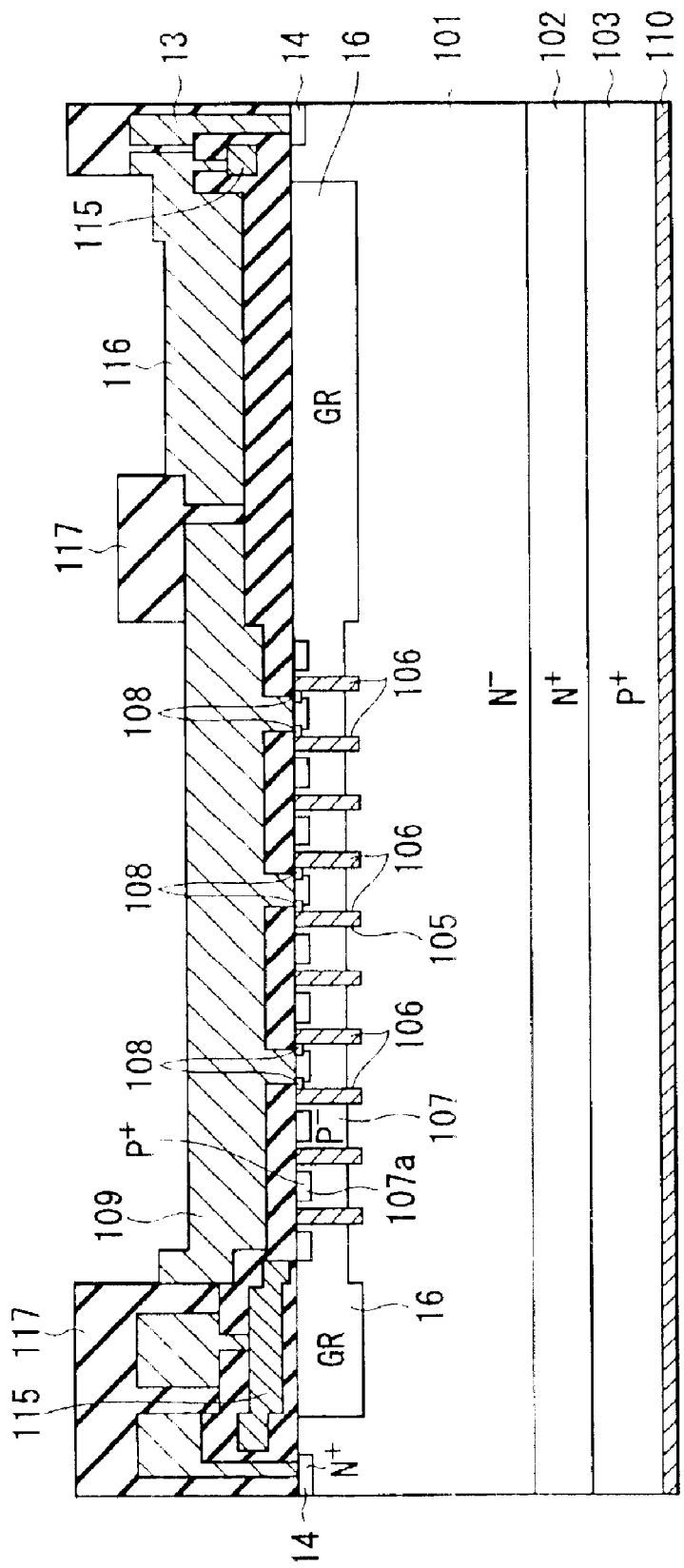
FIG. 1 is a cross-sectional view schematically showing the structure of a conventional IEGT.
Figure 2:
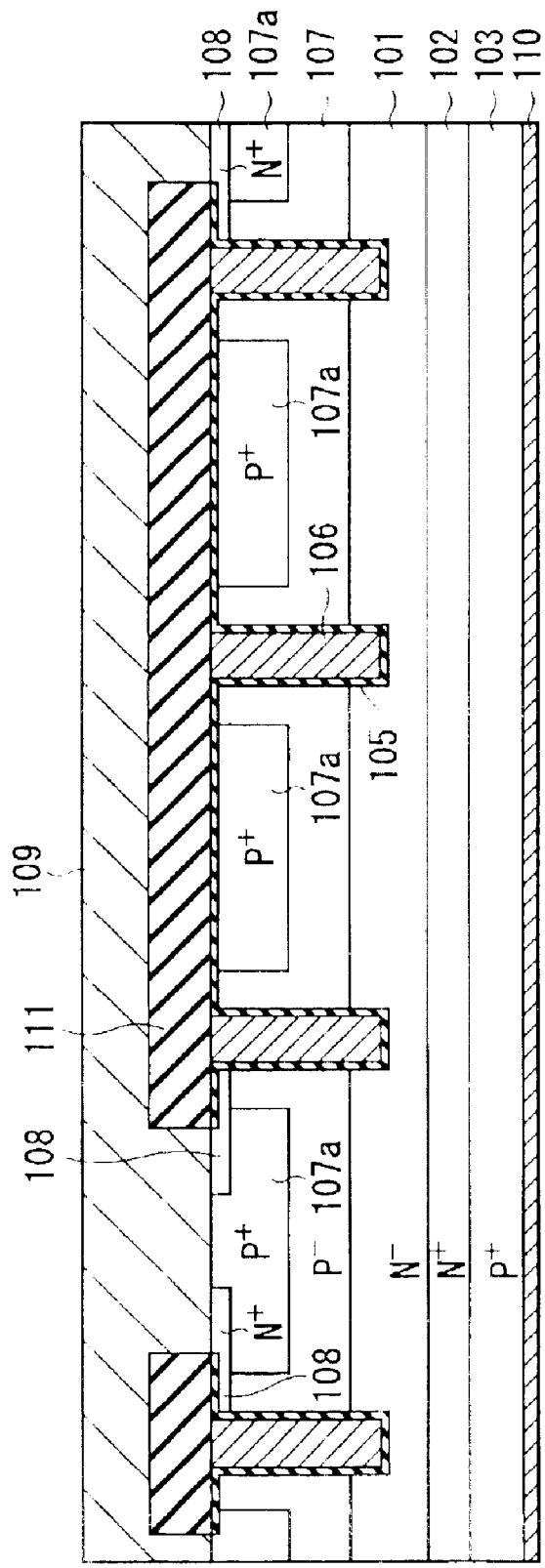
FIG. 2 is an enlarged sectional view showing part of the IEGT shown in FIG. 1.
Figure 3:
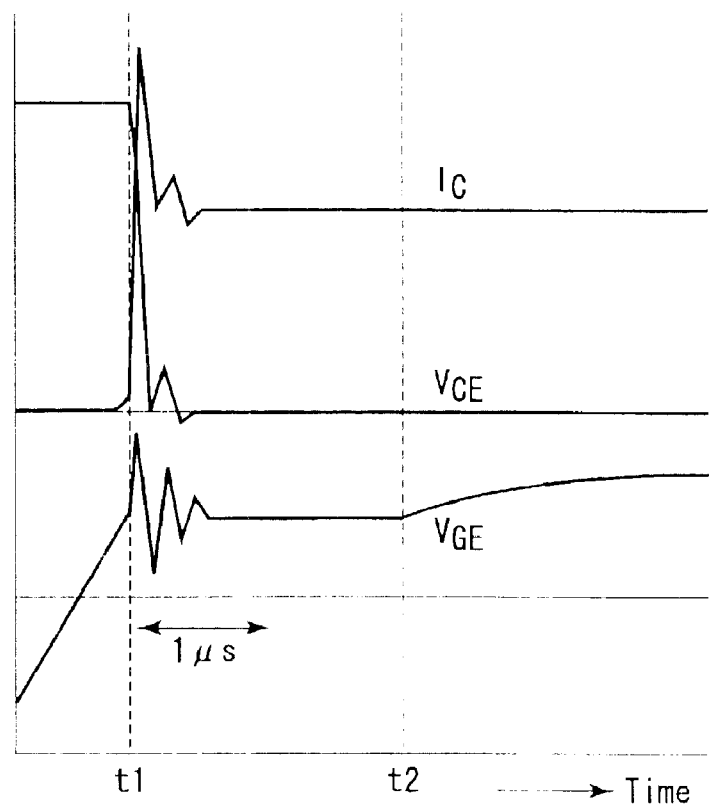
FIG. 3 is a waveform diagram showing one example of oscillation of gate voltage generated by carriers stored near the gate of the IEGT shown in FIG. 1 and FIG. 2.

The operation of the IEGT having the structure described above is basically the same as that of the conventional IEGT described referring to FIG. 1 and FIG. 2. In this case, the P+ diffusion region 114 prevents carriers from being stored to the peripheral portion of the bottom of the trench gate electrode 106a functioning as the MOS gate. Therefore, it is possible to prevent the generation of negative capacitance between carriers stored under the dummy base region and the trench gate electrode 106a.

Figure 7:
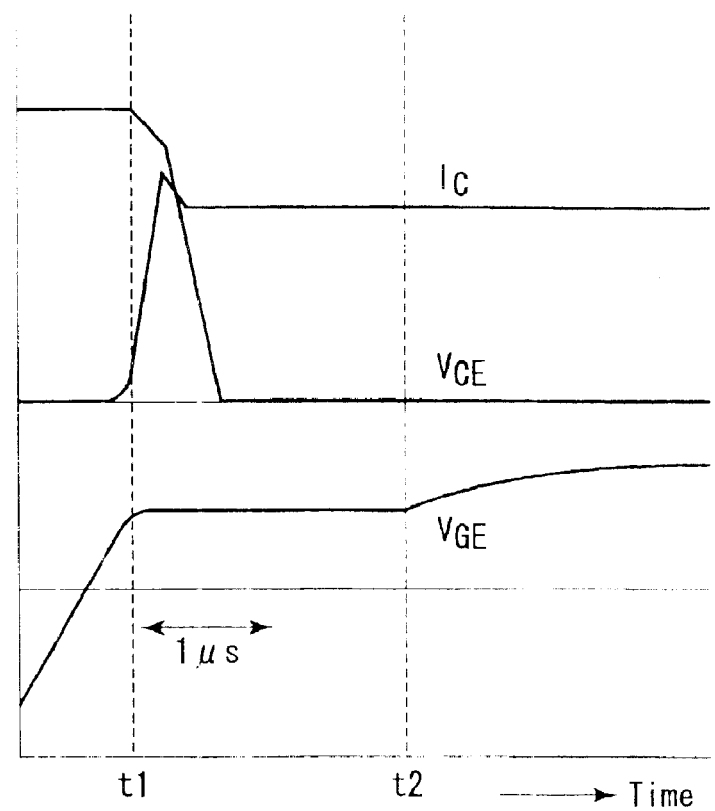

FIG. 7 is a waveform diagram showing the operation when the IEGT shown in FIG. 4 and FIG. 5 turns on.

According to the operation waveform, the following matter can be seen. That is, oscillation of the gate voltage and the step-up more than the necessary are prevented when the IEGT turns on, and the switching speed (dV/dt) is prevented from abnormally becoming high.

Therefore, in the IEGT shown in FIG. 4 and FIG. 5, it is possible to prevent oscillation of the gate voltage and the step-up more than the necessary resulting from the negative capacitance when the IEGT turns on. As a result, it is possible to solve the conventional problem that the switching speed (dV/dt) abnormally becoming high, and thereby causing the breakdown of element.

As described above, in the IEGT of the first embodiment, the P+ diffusion region 114 is provided around the trench 114, and thereby, no carrier is stored to portions where the P+ diffusion region 114 exists. Thus, no negative capacitance is generated between the trench gate electrode 106a and the storage carrier. Consequently, abnormal oscillation of the gate potential does not occur, and the switching speed (dV/dt) control by gate resistance is easy. The range forming the P+ diffusion region 114 is small; therefore, the influence to carrier storage effect is insignificant.

<One Example of the Process of Manufacturing the IEGT of the First Embodiment>

FIG. 8A to FIG. 8K are sectional views schematically showing one example of the process of manufacturing the IEGT according to the first embodiment.

Figure 8A:
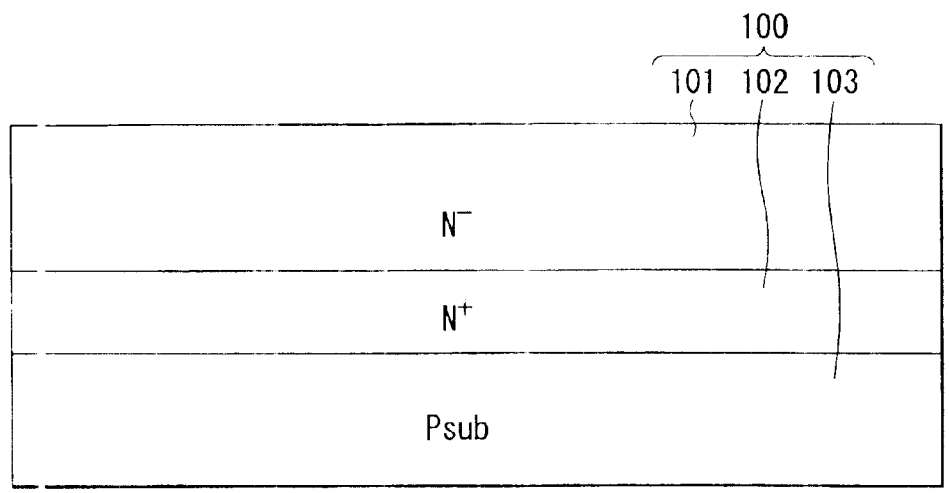
FIG. 8A to FIG. 8K are process sectional views showing a first method of manufacturing the IEGT according to the first embodiment.
Figure 8B:
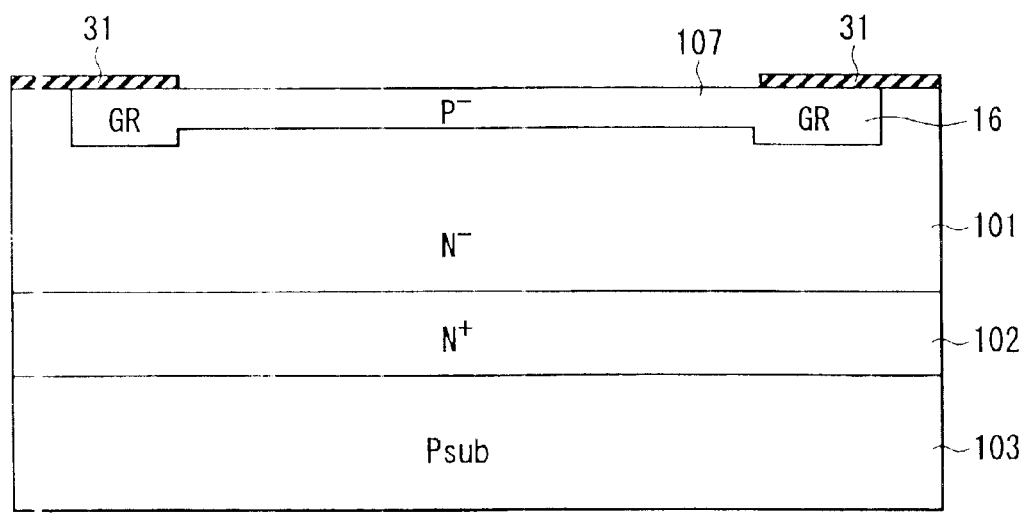

As shown in FIG. 8A, an N−/N+/P+ wafer 100 is prepared. As illustrated in FIG. 8B, a guard ring (GR) 16 is formed in the surface region of the outer peripheral portion of the N− base layer 101, and a SiO₂ film 31 is formed on the N− base layer 101. The SiO₂ film 31 is patterned, and boron ions are implanted into the N-base layer 101 using the SiO₂ film 31 as a mask, then diffusion is done, so that the P− base layer 107 can be formed in the element forming region of the N− base layer 101 surrounded by the guard ring 16.

Figure 8C:
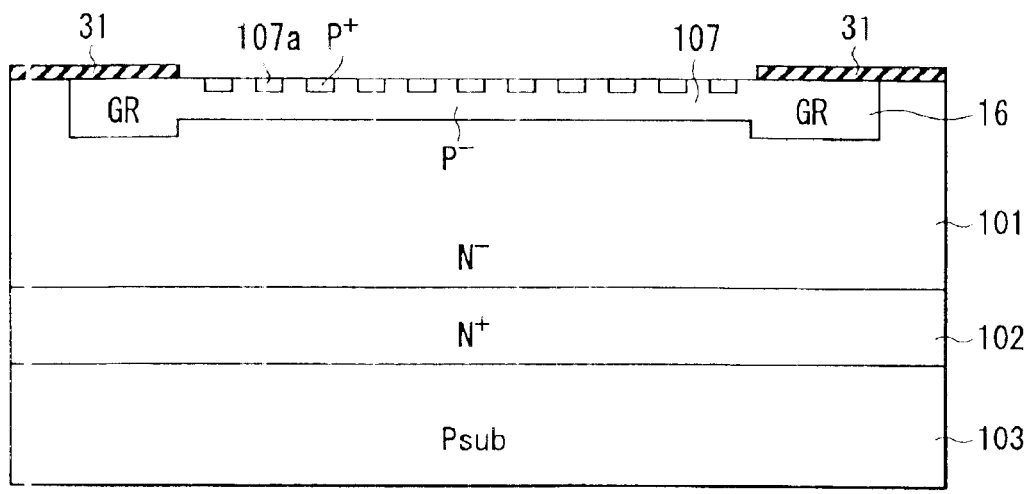
Figure 8D:
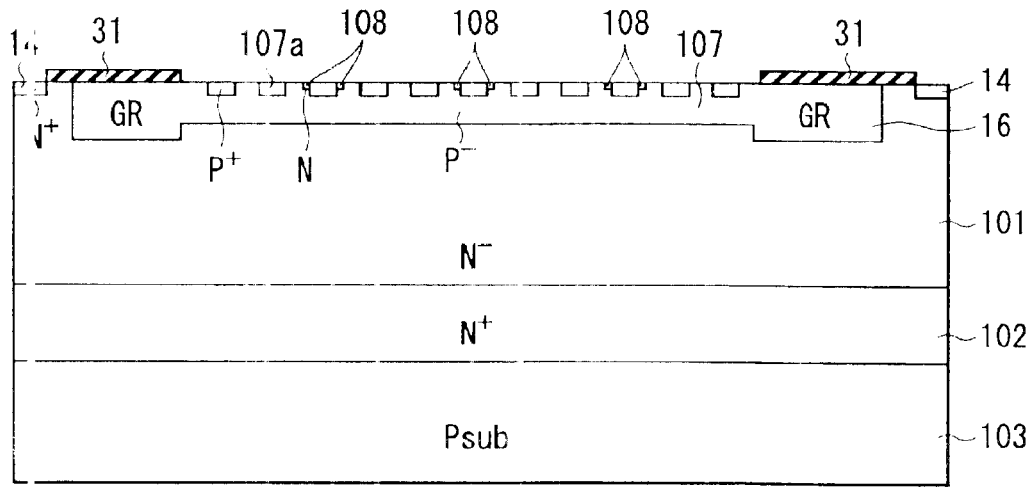
Figure 8E:
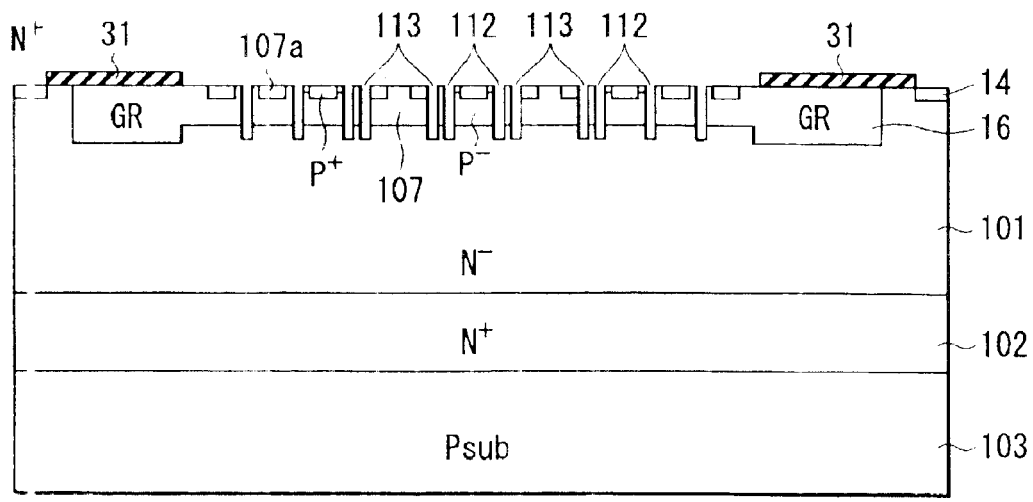

As seen from FIG. 8C, P+ base layers 107a are selectively formed in the surface region of the P− base layer 107 to have a stripe-shaped plane pattern. As depicted in FIG. 8D, the N+ emitter layer 108 is selectively formed in the surface region of the P− base layer selected intermittently from P+ base layers 107a. In this case, the N+ emitter layer 108 is formed to have a ladder or stripe-shaped plane pattern. Simultaneously, the N+ filed stopper layer 14 is formed at the outermost peripheral region of the N− base layer 101. Thereafter, as shown in FIG. 8E, trenches 112 and dummy trenches 113 are selectively formed in the P− base layer 107 of the element forming region. In this case, trenches 112 and dummy trenches 113 are formed to have a stripe-shaped plane pattern and to extend into the N− base layer 101.

Figure 8F:
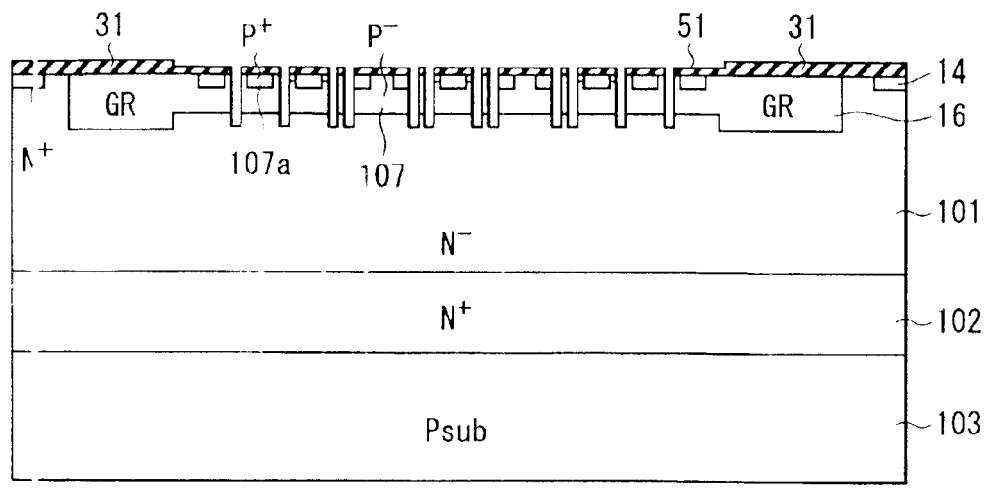
Figure 8G:
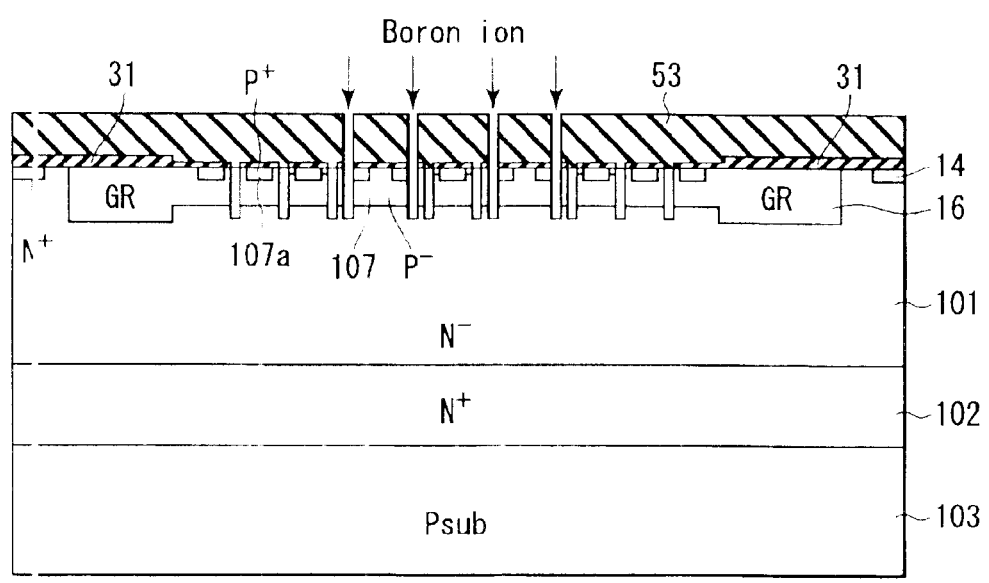

As illustrated in FIG. 8F, sacrificial oxidation is carried out so that a sacrificial oxide film (SiO₂ film) 51 can be formed at each inner surface of the trench 112 and the dummy trench 113. As seen from FIG. 8G, the entire surface is coated with resist 53, and thereafter, the resist 53 and the SiO₂ film 51 are opened correspondingly to the dummy trench 113. Impurities, for example, boron ions are implanted into the bottom surface of the dummy trench 113.

Figure 8H:
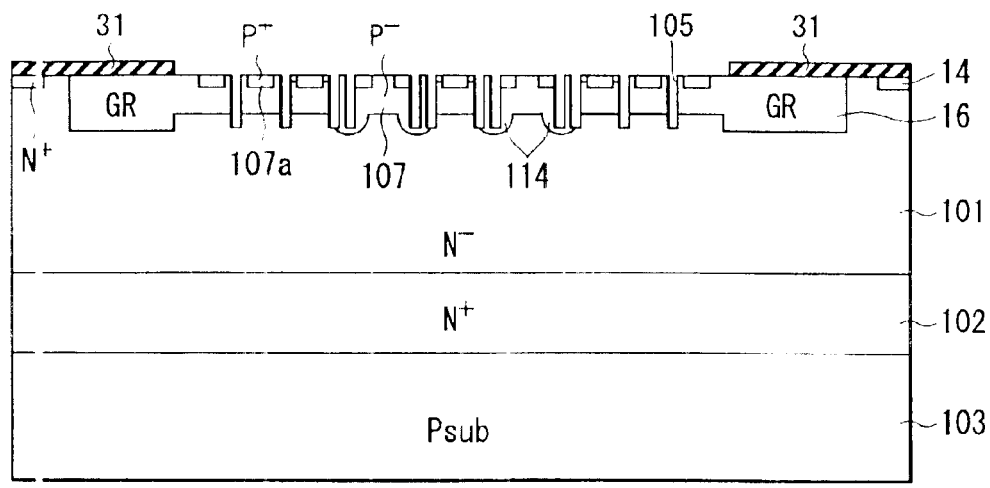
Figure 8I:
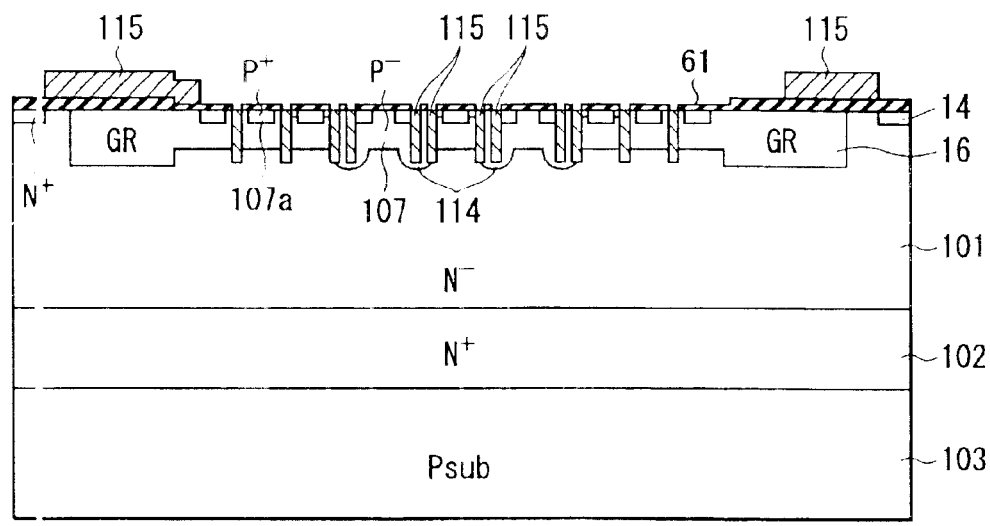

As depicted in FIG 8H, the resist 53 and the sacrificial oxide film 51 are removed. Thereafter, the entire surface is oxidized, a gate oxide film (SiO₂ film) is formed on the surface of the P− base layer 107, P+ base layer 107a and N+ emitter layer 108. Simultaneously, the gate insulator (SiO₂ film) 105 is formed in each inner peripheral surface of the trench 112 and the dummy trench 113. By heat treatment, the P+ diffusion region 114 is formed around the bottom portion of the trenches described above. As seen from FIG. 8I, for example, polysilicon containing P (phosphorus) is deposited on the entire surface by CVD (Chemical Vapor Deposition) process while being buried in the trench 112 and the dummy trench 113. Thereafter, the polysilicon exposed on the upper surface of the substrate is patterned, thereby forming the polysilicon gate interconnect (wiring) 115.

Figure 8J:
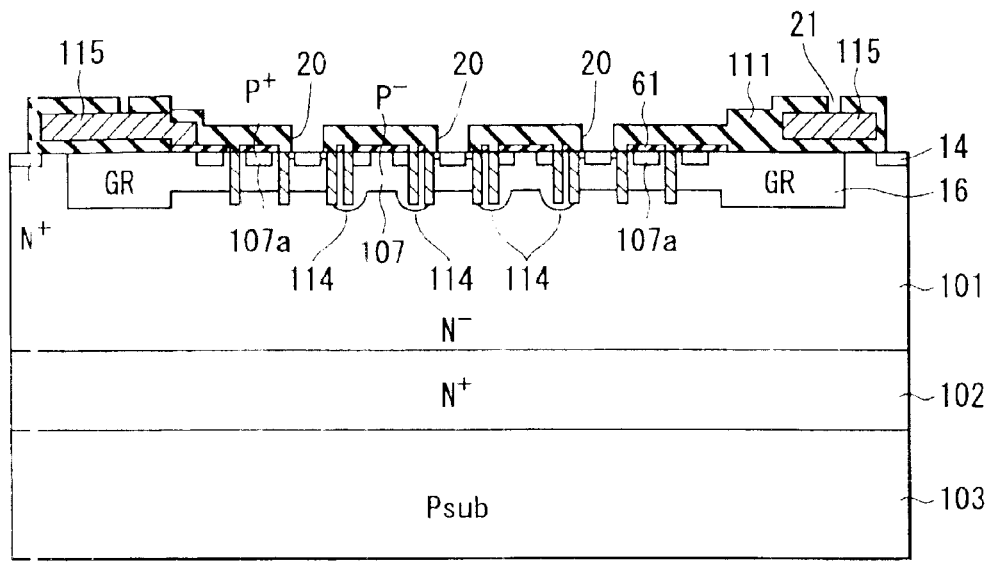
Figure 8K:
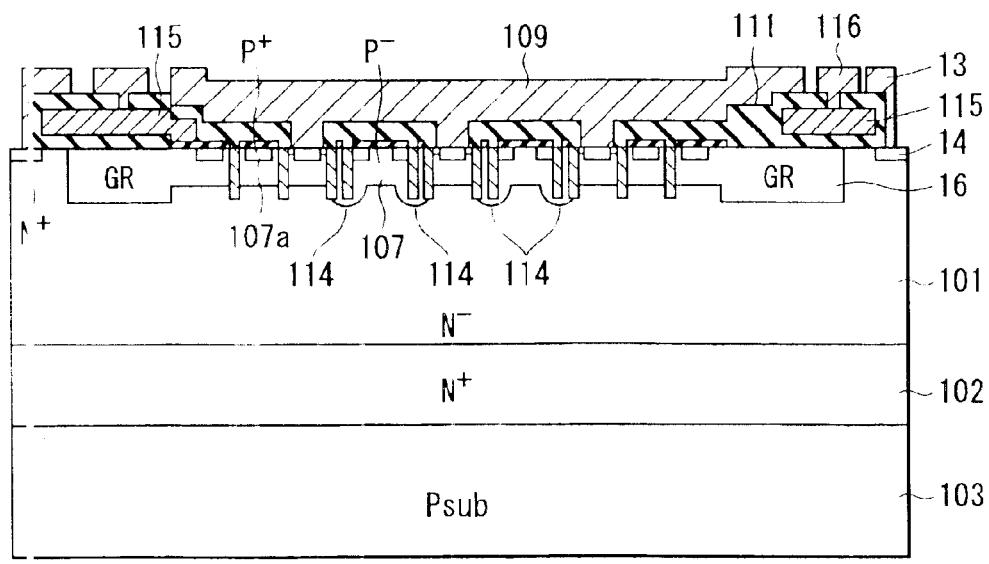

As shown in FIG. 8J, the interlayer dielectric 111 is deposited on the entire surface, and the contact hole 20 is formed in the interlayer dielectric 111 and the gate insulator 61 under there. In this case, the contact hole 20 is an emitter/base draw-out contact hole corresponding to the N+ emitter layer 108 of the base region formed with the N+ emitter layer and part of the P+ base layers 107a. Simultaneously, a contact hole 21 corresponding to part of the polysilicon gate interconnect pattern 115 is formed. As seen from FIG. 8K, a metal interconnect layer (e.g., aluminum interconnect layer) is deposited on the entire surface by sputtering. Thereafter, patterning is carried out so that the emitter electrode 109, gate pad 116 and filed plate 13 can be formed. The filed plate 13 contacts with the N+ filed stopper layer 14 of the element termination.

The passivation film 117 is deposited on the entire surface, and thereafter, patterning is carried out so that the emitter electrode 109 can be exposed. Further, the back side of the substrate is formed with the collector electrode 110. The processes described above are carried out, thereby obtaining the structure shown in FIG. 4.

The manufacturing process described above is briefly described. Namely, the process until the trench is formed is the same as the manufacturing process of the conventional IEGT. The trench is formed while the dummy trench is formed at the position near to there. Thereafter, sacrificial oxidation is carried out so that the sacrificial oxide film 51 can be formed in each inner peripheral surface of the trench and the dummy trench. The entire surface is coated with the resist 53, and openings are formed with respect to the resist 53 used as the dummy trench and the sacrificial oxide film 51. Boron ions are implanted into the bottom portion of the dummy trench via the openings. Thereafter, the resist 53 and the sacrificial oxide film 51 are removed. The process after forming the gate insulator 105 and polysilicon used as gate electrode material is the same as the conventional manufacturing process.

By heat treatment after boron ion implantation, boron ions are diffused so that the P+ diffusion region 114 can be formed around the bottom portion of the trench gate electrode 106a. The diffusion depth of boron by the heat treatment depends on heat treatment conditions; usually, the diffusion depth is less than 1 μm. Therefore, it is preferable that the interval between the trench 112 for the trench gate electrode 106a and the dummy trench 113 is set less than 1.0 μm.

According to the manufacturing process of the IEGT described above, the IEGT of the first embodiment can be readily manufactured. In addition, the interval between the trench for the trench gate electrode 106a and the dummy trench 113, that is, the diffusion depth of boron by heat treatment is limited to 1.0 μm or less. By doing so, the P+ diffusion region 114 can be high accurately formed to reach the bottom portion of the trench gate electrode 106a.

In the IEGT having the structure shown in FIG. 4 and FIG. 5, the N+ emitter layer 108 is formed having the ladder or stripe-shaped plane pattern. Namely, the N+ emitter layer 108 and the exposed portion of the P+ base layer 107a are formed so that they can be alternately positioned. By doing so, even if the contact opening width becomes small with the reduction of cell pitch, the emitter electrode 109 can sufficiently short-circuit the N+ emitter layer 108 and the P+ base layer 107a. However, there is the case where the interval between trench gate electrodes 106a, that is, the cell pitch is relatively wide, and the contact opening width is wider than processing accuracy. In this case, even if the plane pattern of the N+ emitter layer 108 is formed into the stripe shape, the emitter electrode 109 can short-circuit both N+ emitter layer 108 and P+ base layer 107a in the entire surface of the direction parallel to the trench.

The plane pattern of the gate trench is not limited to the stripe shape, and may be formed into a lattice or staggering shape.

<Another Example of the Process of Manufacturing the IEGT of the First Embodiment>

FIG. 9A to FIG. 9F are sectional views schematically showing another example of the process of manufacturing the IEGT according to the first embodiment.

The same process as described referring to FIG. 8A to FIG. 8E is carried out.

Figure 9A:
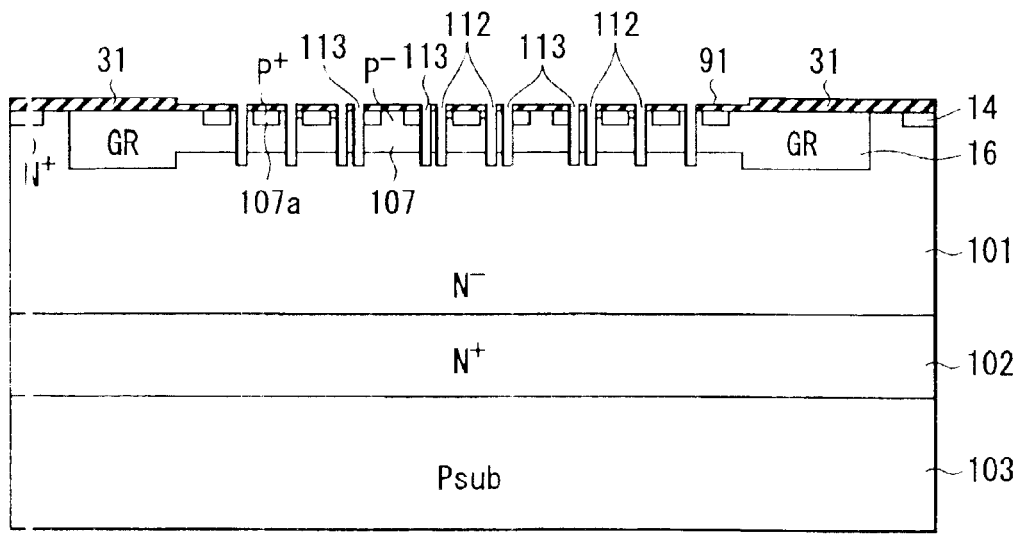
FIG. 9A to FIG. 9F are process sectional views showing a second method of manufacturing the IEGT according to the first embodiment.
Figure 9B:
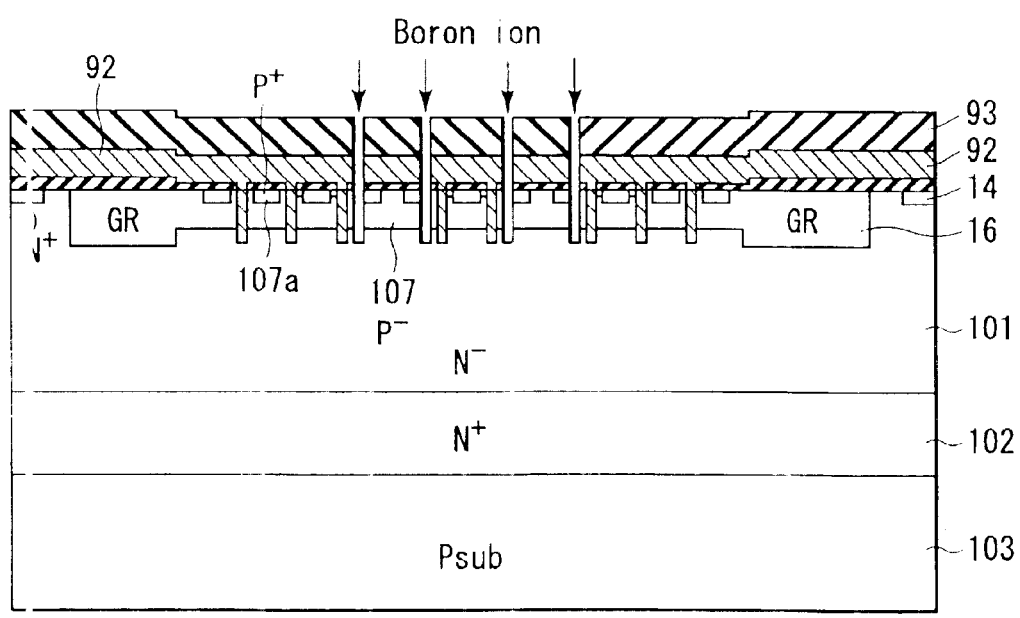

As illustrated in FIG 9A, the entire surface is oxidized, and a gate oxide film ($SiO_2$ film) 91 is formed on the surface region of the P-base layer 107, P+ base layer 107a and N+ emitter layer 108. Simultaneously, the gate insulator ($SiO_2$ film) 105 is formed in each inner peripheral surface of the trench 112 and the dummy trench 113. As seen from FIG 9B, for example, polysilicon 92 containing P (phosphorus) is deposited on the entire surface by CVD (Chemical Vapor Deposition) process while being buried in the trench 112 and the dummy trench 113. The entire surface is coated with resist 93, and patterning is carried out so that openings can be formed correspondingly to the dummy trenches 113. The polysilicon 92 buried in the dummy trench 113 is removed using the resist pattern. Thereafter, boron ions are implanted into the bottom portion of the dummy trench 113.

Figure 9C:
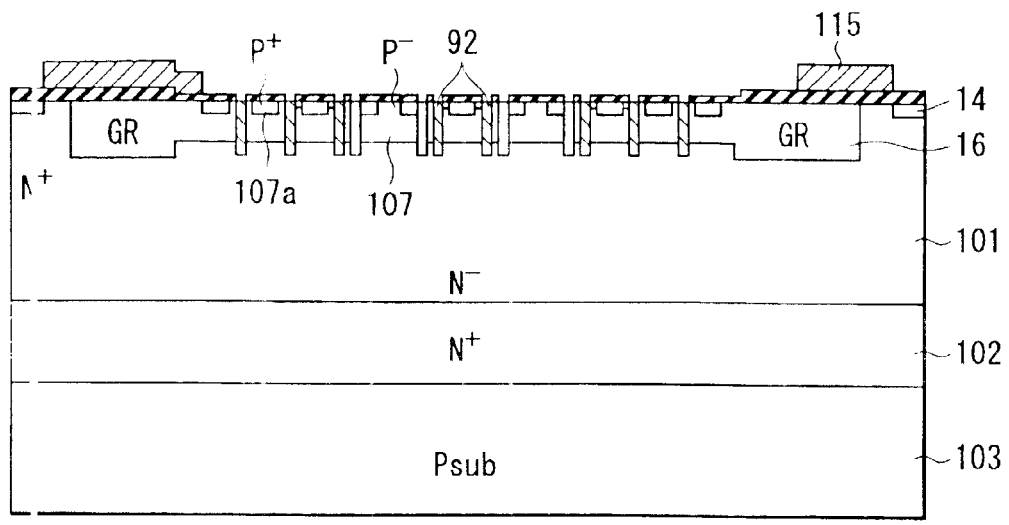
Figure 9D:
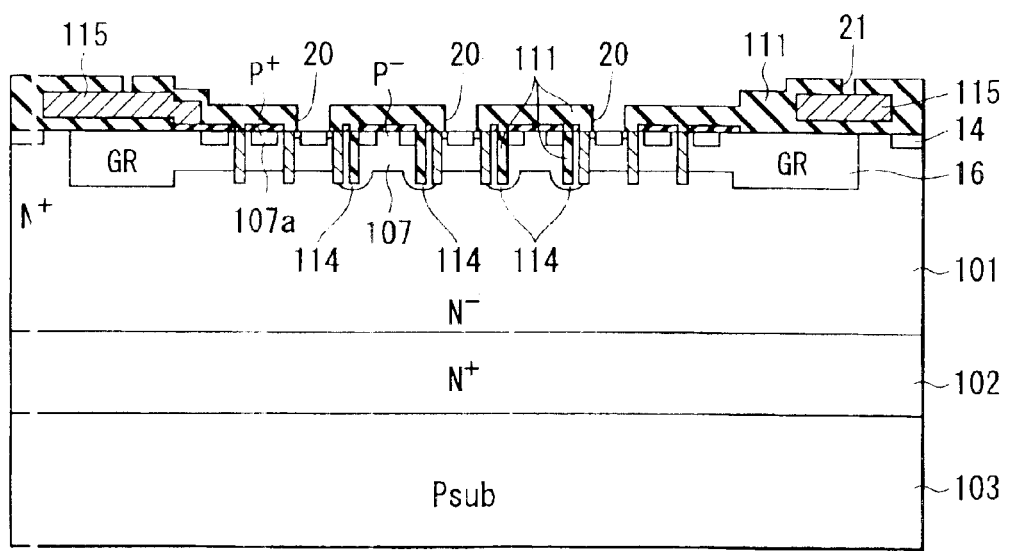
Figure 9E:
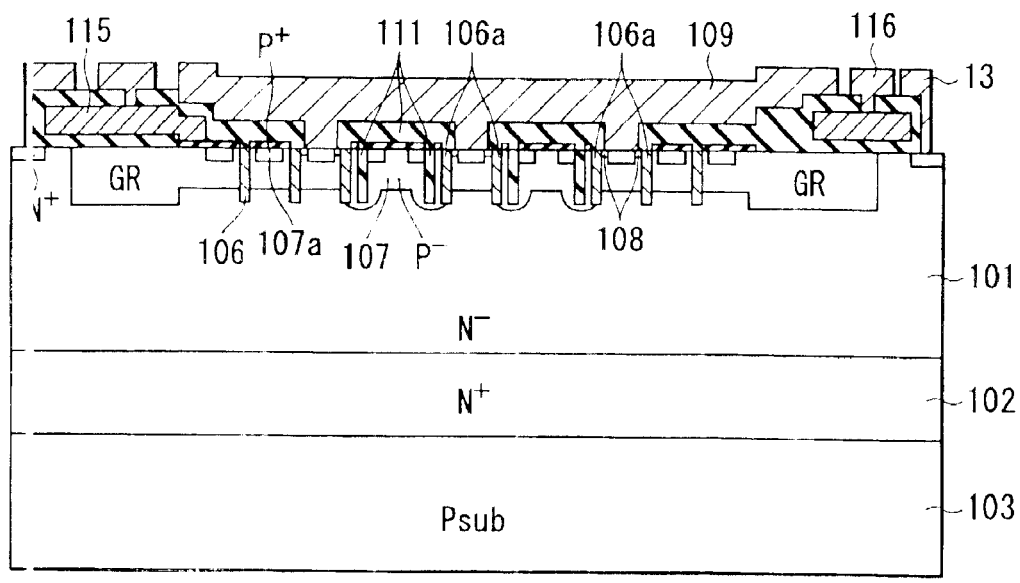

As depicted in FIG. 9C, the resist 93 is removed, and thereafter, the polysilicon exposed on the upper surface of the substrate is patterned, thereby forming the polysilicon gate interconnect (wiring) 115. As shown in FIG. 9D, the interlayer dielectric 111 is deposited on the entire surface while being buried into the trench 113. By heat treatment, the P+ diffusion layer 114 is formed around the bottom portion of the trench 112.

The interlayer dielectric 111 is deposited on the entire surface, and the contact hole 20 is formed in the interlayer dielectric 111 and the gate insulator 91 under there. In this case, the contact hole 20 is an emitter/base draw-out contact hole corresponding to the N+ emitter layer 108 of the base region formed with the N+ emitter layer and part of the P+ base layers 107a. Simultaneously, a contact hole 21 corresponding to part of the polysilicon gate interconnect pattern 115 is formed.

Figure 9F:
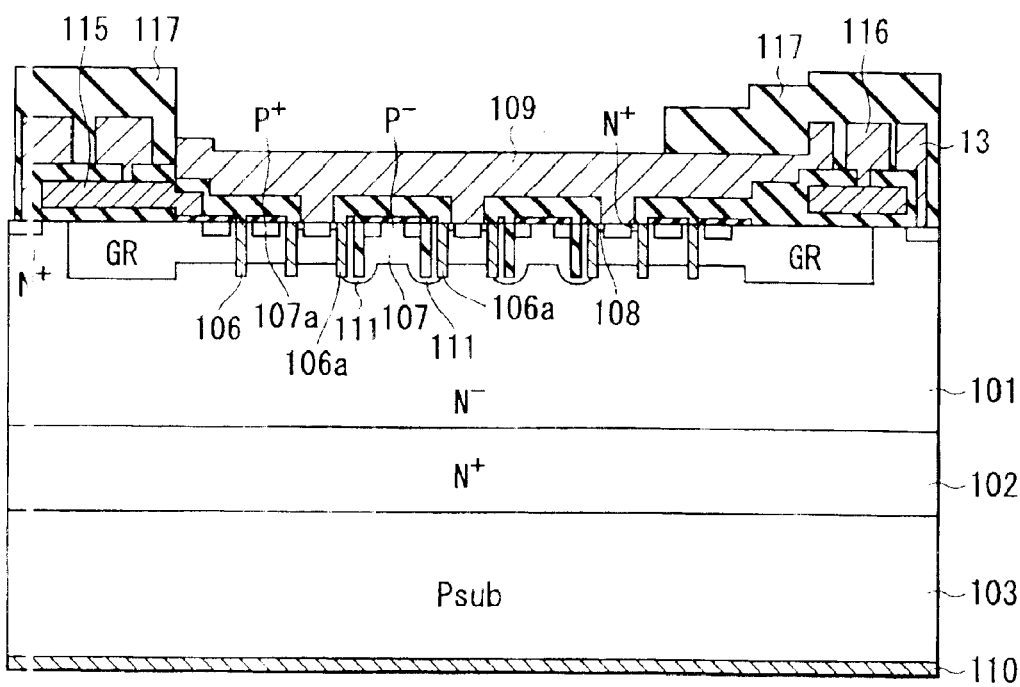

The process until the collector electrode 110 is formed is the same as one example of the process of the first embodiment. As seen from FIG. 9E, a metal interconnect layer (e.g., aluminum interconnect layer) is deposited on the entire surface by sputtering. Thereafter, predetermined patterning is carried out so that the emitter electrode 109, gate pad 116 and field plate 13 can be formed. The field plate 13 contacts with the N+ field stopper layer 14 of the element termination. As shown in FIG. 9F, the back side of the substrate is formed with the collector electrode 110. The passivation film 117 is deposited on the entire surface, and thereafter, patterning is carried out, thereby exposing the emitter electrode 109.

The manufacturing process described above is briefly described. Namely, the process until the trench 112 is formed is the same as the manufacturing process of the conventional IEGT. The trench 112 is formed while the dummy trench 113 is formed at the position near to there. Thereafter, the gate insulator 105 is formed, and polysilicon used as gate electrode material is formed in the trench 112 and the dummy trench 113. Thereafter, the entire surface is coated with resist 92, and openings are formed correspondingly to the dummy trenches 113. The polysilicon in the dummy trench 113 is removed. Boron ions are implanted into the bottom portion of the dummy trench 113, and thereafter, the interlayer dielectric 111 is buried in the dummy trench 113. The process after that is the same as the conventional manufacturing process.

<Modification Example 1 of IEGT of the First Embodiment>

The first embodiment has described the following structure. Namely, the N+ emitter layer 108 is formed in the base region selected every interval of constant number (two or more) of several base regions. In addition, there exist both of the base region where the dummy trench 113 is formed and the base region where it not formed, as the base region where the N+ emitter layer 108 is not formed. According to the modification example 1, the N+ emitter layer 108 is formed in the base region selected alternately of several base regions. By doing so, modification may be made so that the dummy trench 113 necessarily exists in the base region where the N+ emitter layer 108 is not formed.

Figure 10:
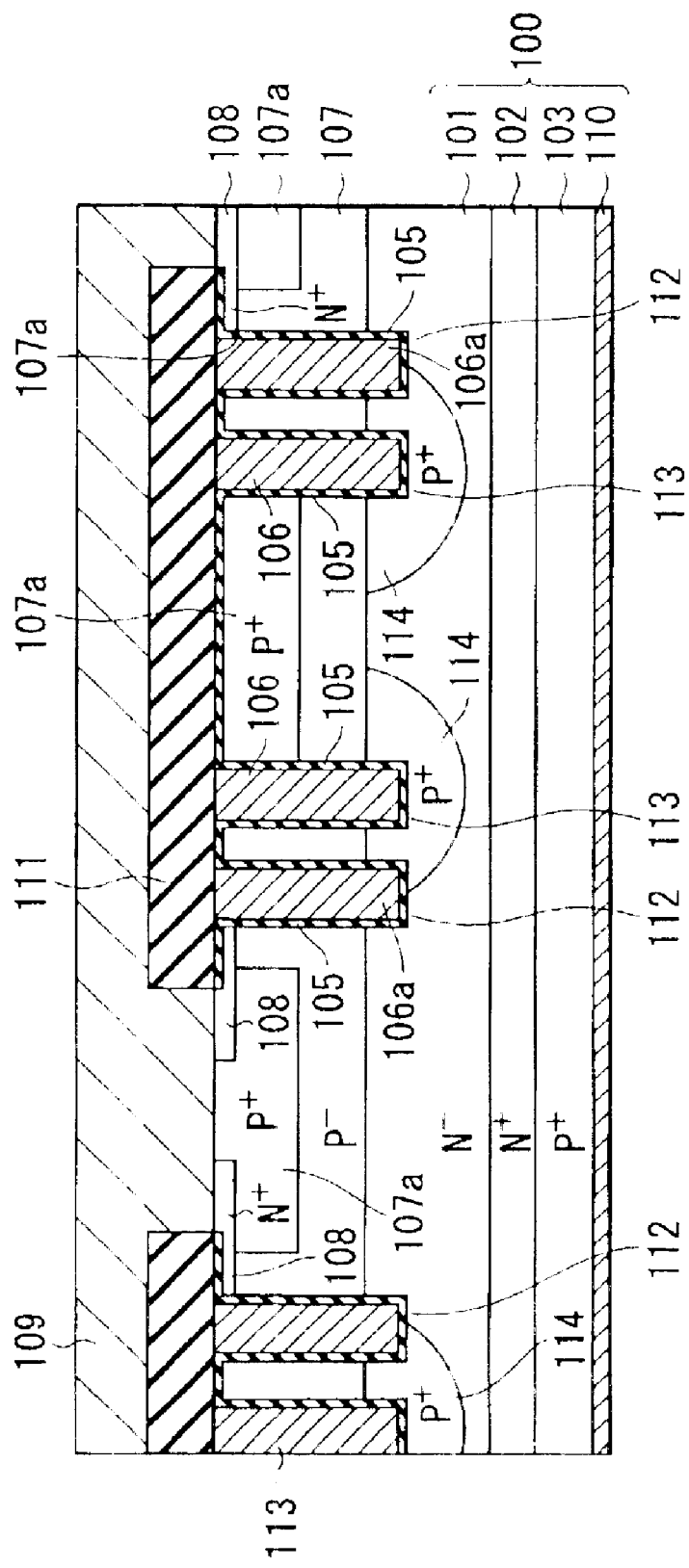
FIG. 10 is a cross-sectional view schematically showing a first modification example of the structure of the IEGT according to the first embodiment.

FIG. 10 is a cross-sectional view showing the modification example 1 of the IEGT of the first embodiment.

The IEGT is different from the structure of the IEGT shown in FIG. 5 in that the N+ emitter layer 108 is formed in the base region selected alternately of several base regions. Other structure is the same as that shown in FIG. 5;

therefore, the same reference numerals are given to portions identical to FIG. 5.

In the IEGT having the structure described above, the same effect can be obtained by the same operation as the IEGT of the first embodiment.

<Modification Example 2 of IEGT of the First Embodiment>

The first embodiment has described the following structure. Namely, the P$^+$ base layer 107a is formed in the surface region of the P$^-$ base layer in each of several base regions. In addition, the contact hole 20 for connecting the P$^+$ base layer 107a and the N$^+$ emitter layer 108 is formed in the predetermined region where the N$^+$ emitter layer 108 is formed. According to the modification example 2, the P$^+$ base layer 107a is formed in only predetermined base region of several base regions, and no P$^+$ base layer 107a is formed in other base regions.

Figure 11:
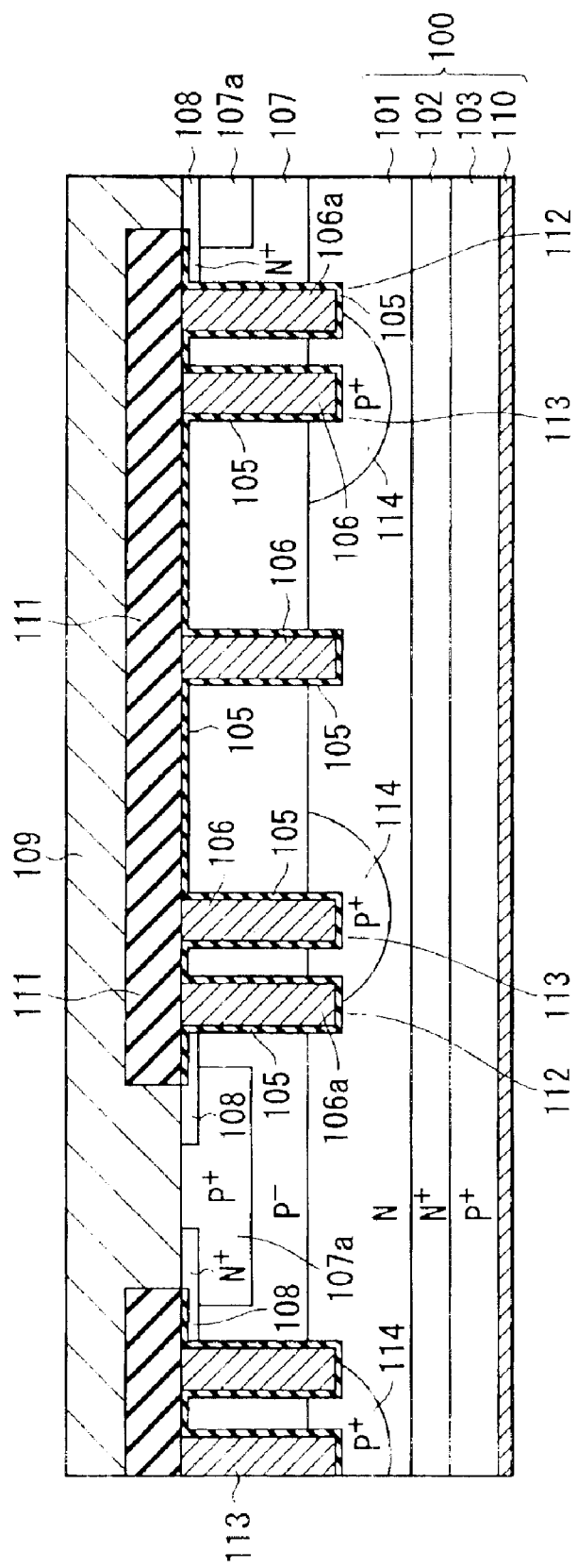
FIG. 11 is a cross-sectional view schematically showing a second modification example of the structure of the IEGT according to the first embodiment.

FIG. 11 is a cross-sectional view showing the modification example 2 of the IEGT of the first embodiment.

The IEGT is different from the structure of the IEGT shown in FIG. 5 in that the P$^+$ base layer 107a is omitted in the base region where the N$^+$ emitter layer 108 is not formed. Other structure is the same as that shown in FIG. 5; therefore, the same reference numerals are given to portions identical to FIG. 5.

In the IEGT having the structure described above, the same effect can be obtained by the same operation as the IEGT of the first embodiment.

<Structure of Second Embodiment and Manufacturing Process>

Figure 12:
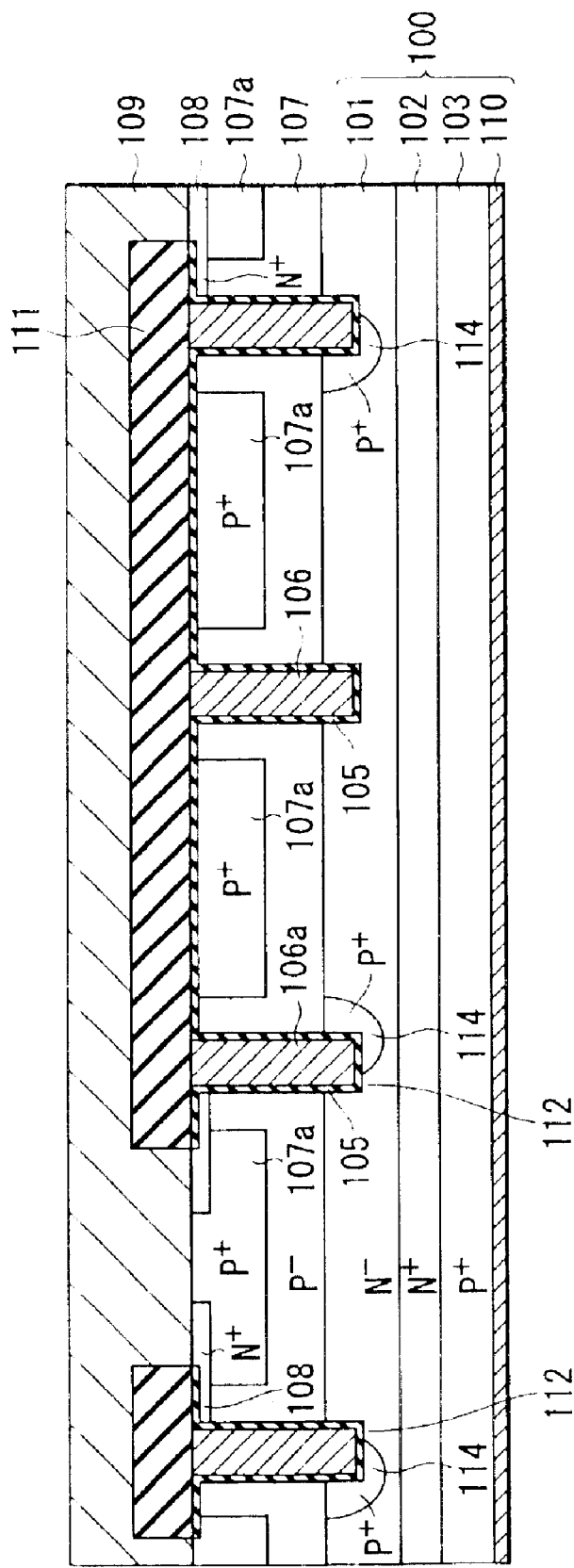
FIG. 12 is a cross-sectional view schematically showing the structure of principal parts of an IEGT according to a second embodiment of the present invention.

FIG. 12 is a cross-sectional view schematically showing the structure of principal parts of an IEGT according to a second embodiment of the present invention.

The structure of the IEGT is different from the structure of the IEGT shown in FIG. 4 and FIG. 5 in that the dummy trench is omitted. Other structure is the same as that shown in FIG. 4 and FIG. 5; therefore, the same reference numerals are given to portions identical to FIG. 5.

When manufacturing the IEGT having the structure described above, boron ions are implanted obliquely or other method. In this case, ions are implanted to the bottom of the trench 112 for the trench gate electrode 106a functioning as the MOS gate of the IEGT and to the side portion opposite to the N$^+$ emitter layer 108. Boron ions are diffused by heat treatment after that. By doing so, the P$^+$ diffusion layer 114 is formed around the bottom portion of the trench 112 adjacent to the base region where the N$^+$ emitter layer 108 is formed. In this case, the P$^+$ diffusion layer 114 is formed to contact with at least part of the side opposite to the N$^+$ emitter layer 108 and the lower portion of bottom surface. Therefore, the P$^+$ diffusion layer 114 can be formed without forming the dummy trench 113 required in the first embodiment.

The present invention is not limited to the embodiments, and various modifications can be made. Namely, the first conduction type may be used as p-type; on the other hand, the second conduction type may be used as n-type. In addition, the collector electrode does not need to be directly provided on the collector layer. The collector electrode may be provided in a manner that the collector layer is drawn out to other portion, for example, the surface side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An insulated gate type semiconductor device comprising:
   a first base layer of a first conductive type having first and second surfaces;
   a second base layer of a second conductive type formed in the first surface region of the first base layer;
   a plurality of trenches formed over a range from the surface of the second base layer to the first base layer, and dividing the second base layer into a plurality of base regions;
   a plurality of trench gate electrodes formed in the plurality of trenches via a gate insulator;
   an emitter layer of a first conductive type formed in a surface region of at least one base region intermittently selected from the plurality of base regions positioned between the plurality of trenches, and contacting with the selected trench;
   a collector layer of a second conductive type formed above the second surface of the first base layer;
   a first main electrode formed to contact with each of at least one base region and the emitter layer;
   a second main electrode electrically connected to the collector layer;
   a plurality of dummy trenches formed over a range from the surface of the base region of the plurality of base regions where the emitter layer is not formed to the first base layer at a position near to each of the plurality of trenches; and
   a first diffusion region of a second conductive type formed in the first base layer and contacting a bottom portion of each trench and a dummy-trench-side side portion of each trench.

2. A device according to claim 1, wherein the first diffusion region is formed to extend from the bottom portion of the dummy trench to that of the trench.

3. A device according to claim 1, wherein the first diffusion region has non-symmetrical diffusion distribution in the side portion of the dummy trench via the trench and the side opposite thereto.

4. A device according to claim 2, wherein the first diffusion region is formed in the first base layer to contact with the second base layer.

5. A device according to claim 2, wherein an interval between each of the plurality of trenches and each of the plurality of dummy trenches provided adjacent thereto is set less than 1.0 µm.

6. A device according to claim 1, wherein each of a plurality of the trenches and each of the plurality of the dummy trenches have approximately the same depth.

7. A device according to claim 1, further comprising:
   a second diffusion region of a second conductive type formed in the surface region of the second base layer, and having an impurity concentration higher than the second base layer,
   the first main electrode contacting with the second diffusion region at a position of at least one base region.

8. A device according to claim 7, wherein the second diffusion region is formed in only a surface region of the at least one base region.

9. A device according to claim 1, wherein the at least one base region is a region selected every two or more constant intervals of the plurality of base regions.

10. A device according to claim 1, wherein the at least one base region is a region alternately selected from the plurality of base regions, and no dummy trench exists in a base region where the emitter layer is not formed.

11. A device according to claim 1, wherein each of the plurality of dummy trenches is formed with an insulator.

12. A device according to claim 1, wherein each of the plurality of dummy trenches is formed with a conductor via a gate insulator.

13. A device according to claim 12, wherein the conductor formed in each of the plurality of dummy trenches is electrically isolated from the plurality of trench gate electrodes.

14. A device according to claim 1, wherein the second main electrode is formed on the collector layer.

15. A device according to claim 1, wherein each of the plurality of dummy trenches is formed in a region sandwiched between the plurality of trenches.

16. An insulated gate type semiconductor device comprising:
- a first base layer of a first conductive type having first and second surfaces;
- a second base layer of a second conductive type formed in the first surface region of the first base layer;
- a plurality of trenches formed over a range from the surface of the second base layer to the first base layer, and dividing the second base layer into a plurality of base regions;
- a plurality of trench gate electrodes formed in the plurality of trenches via a gate insulator;
- an emitter layer of a first conductive type formed in a surface region of at least one base region intermittently selected from the plurality of base regions positioned between the plurality trenches, and contacting with a selected trench;
- a collector layer of a second conductive type formed above the second surface of the first base layer;
- a first main electrode formed to contact with each of at least one base region and the emitter layer;
- a second main electrode electrically connected to the collector layer; and
- a first diffusion region of a second conductive type formed in the first base layer, formed between the selected trench and another trench contacting another emitter layer, formed to be in contact with only the selected trench, and formed to be in contact with a bottom portion of the selected trench and a side portion of the selected trench opposite the emitter layer.

17. A device according to claim 16, wherein the first diffusion region has non-symmetrical diffusion distribution in the side portion of the selected trench via the trench and the side opposite thereto.

18. A device according to claim 16, wherein the first diffusion region is formed in the first base layer to contact with the second base layer.

19. A device according to claim 16, comprising a second diffusion region of the second conductive type formed, separate from said first diffusion region, between said another trench and said selected trench, said second diffusion region formed to be in contact only with the another trench, and formed to be in contact with a bottom portion of the another trench and a side portion of the another trench opposite the another emitter layer.

* * * * *